United States Patent [19]
McClure

[11] Patent Number: 6,101,618
[45] Date of Patent: *Aug. 8, 2000

[54] METHOD AND DEVICE FOR ACQUIRING REDUNDANCY INFORMATION FROM A PACKAGED MEMORY CHIP

[75] Inventor: David Charles McClure, Carrollton, Tex.

[73] Assignee: STMicroelectronics, Inc., Carrolton, Tex.

[ * ] Notice: This patent issued on a continued prosecution application filed under 37 CFR 1.53(d), and is subject to the twenty year patent term provisions of 35 U.S.C. 154(a)(2).

[21] Appl. No.: 08/172,848

[22] Filed: Dec. 22, 1993

[51] Int. Cl.$^7$ .................................................. H02H 3/05
[52] U.S. Cl. .............................................. 714/27; 714/25
[58] Field of Search .................................. 371/21.1, 10.1, 371/10.2, 10.3, 5.1; 395/575; 714/25, 27, 30, 31, 43, 42, 742, 743

[56] References Cited

U.S. PATENT DOCUMENTS

| | | | |
|---|---|---|---|
| 4,586,170 | 4/1986 | O'Toole et al. | 365/200 |
| 4,860,260 | 8/1989 | Saito et al. | 365/201 |
| 5,157,664 | 10/1992 | Waite | 371/10.2 |
| 5,247,481 | 9/1993 | Conan | 365/200 |
| 5,265,100 | 11/1993 | McClure | 371/21.2 |
| 5,267,197 | 11/1993 | McClure | 365/189.01 |
| 5,293,386 | 3/1994 | Muhmenthaler et al. | 371/21.1 |
| 5,311,473 | 5/1994 | McClure et al. | 365/201 |
| 5,327,382 | 7/1994 | Seno et al. | 365/210 |
| 5,363,382 | 11/1994 | Tsukokushi | 371/21.2 |

OTHER PUBLICATIONS

R.W. Haddad et al., "Increased Throughput for Testing and Repair of Rams w/ Redundancy," IEEE Trans. on Computers, vol. 40, No. 2, Feb. 1991, pp. 154–166.

P. Mazumder et al., "Parallel Testing Pattern–Sensitive Faults in Semiconductor Random–Access Memories," IEE Trans. on Computers, vol. 38, No. 3, Mar. 1989, pp. 394–407.

*Primary Examiner*—Norman M. Wright
*Attorney, Agent, or Firm*—Theodore E. Galanthay; Lisa K. Jorgenson; Dan Venglarik

[57] ABSTRACT

A method and circuit for testing a packaged semiconductor memory device allow the acquisition of information on redundant elements by performing one of three possible redundancy rollcall tests on the packaged memory chip. By stimulating the packaged device's pins, the memory chip is set in one of the three test modes. In the first test mode, a preset signal indicating redundancy is sensed and the state of an output pin is changed. In the second test mode, memory array rows are sequentially addressed and the state of an output pin is changed when a redundant row is addressed. In the third test, array columns are sequentially addressed and, when a redundant column is addressed, the state of the output pin to which the redundant column is mapped is changed.

9 Claims, 4 Drawing Sheets

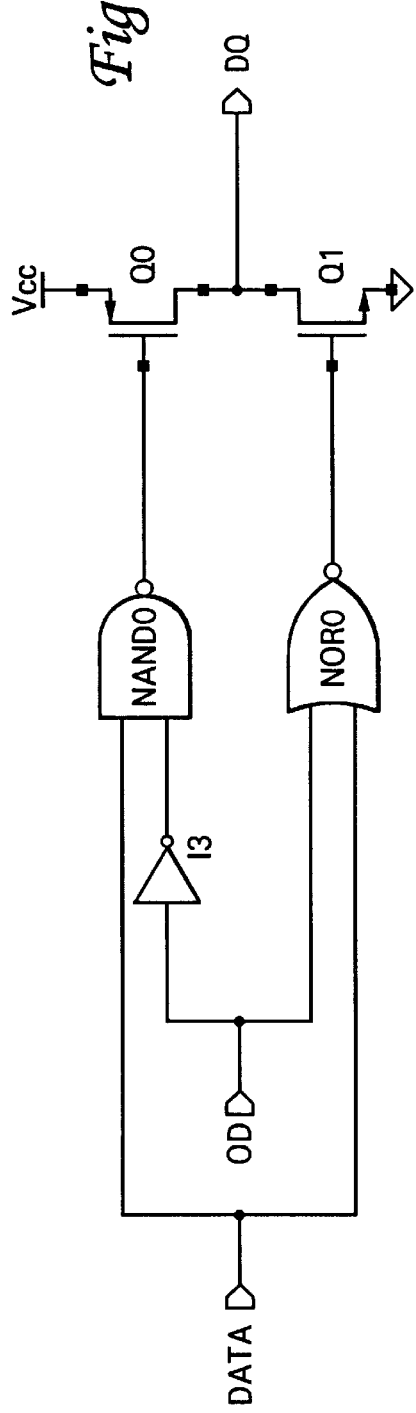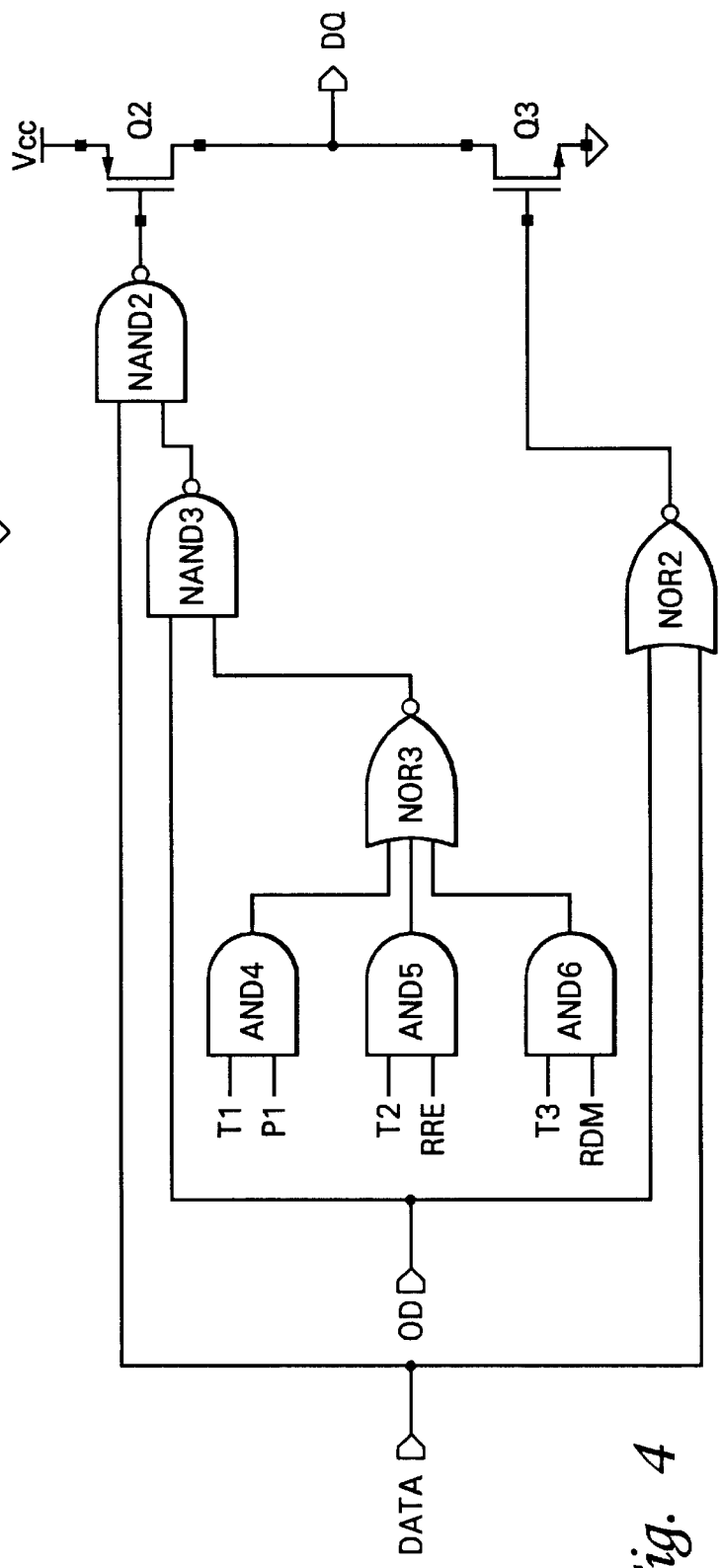

METHOD AND DEVICE FOR ACQUIRING REDUNDANCY INFORMATION FROM A PACKAGED MEMORY CHIP

BACKGROUND OF THE INVENTION

1. Field of the Invention

The present invention relates in general to a method of testing a packaged semiconductor memory array for redundancy implementation and, in particular, to a test circuit for acquiring redundancy information from a packaged memory chip.

2. Description of the Prior Art

There exists a need to identify the locations and extent of redundancy implementation on packaged semiconductor parts such as a memory array. Information such as whether a part has been repaired, whether row or column redundancy has been implemented, and on which address, is useful in the manufacture of semiconductor parts. This redundancy information can be utilized with failure analysis, device debugging, and yield analysis.

In particular, it would be desirable to have the capability of performing multiple tests on packaged parts which would provide information on the redundancy implemented in order to improve production analysis of packaged semiconductor chips ready for shipping. These tests would allow the following questions to be answered: 1) Is the device prime or has it been repaired with redundant elements? 2) Has row redundancy been implemented, and on which row addresses? 3) Has column redundancy been implemented, on which column addresses, and for which output? The present invention provides a method and system for testing a packaged semiconductor part in order to answer these important questions of memory array redundancy implementation.

SUMMARY OF THE INVENTION

Therefore, in accordance with the present invention, a method and device for testing a packaged semiconductor memory device allow the acquisition of information on redundant elements by performing three possible redundancy rollcall tests on a packaged memory chip. By stimulating the packaged device's pins, the memory chip is set in one of the three test modes. In the first test mode, a preset signal indicating redundancy is sensed and the state of an output pin is changed. In the second test mode, memory array rows are sequentially addressed. The state of an output pin is changed when a redundant row is addressed. In the third test, array columns are sequentially addressed. When a redundant column is addressed, the state of the output pin to which the redundant column is mapped is changed.

DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

FIG. 3 is a schematic diagram of a memory device output buffer;

FIG. 4 is a schematic diagram of a memory device output buffer containing a redundancy rollcall test circuit as described in a preferred embodiment of the present invention.

DESCRIPTION OF THE PREFERRED EMBODIMENT

The present invention provides a test circuit which allows redundancy rollcall testing of a packaged semiconductor memory array. This invention allows the packaged part to be tested externally through its pins in order to acquire redundancy information about the memory chip contained within the packaged part. This type of information is extremely useful to a production engineer in yield and failure analysis of the memory device after the final production stage of packaging the part, and to the customer in evaluating the part. Although this testing could be performed at a previous stage of production, such as while the chip is in wafer form, it is difficult to keep track of each individual chip after the wafer has been diced. Moreover, additional damage or production problems may occur at later stages of the production line which effect yield and failure analysis. Thus, the advantage of being able to test a final packaged product for redundancy implementation is apparent.

The present invention provides three "redundancy rollcall" tests. Which test mode is being exercised is decoded based on a test entry stimulus. For example, this decoding may be based on which pins get a supervoltage or the state of other pins after a supervoltage is applied. The invention sets the part's output pins at either a high impedance or a low impedance depending on the test mode entered and the results of the test performed. The three test modes provide information on:

Test Mode One) is the device prime or has it been repaired?

Test Mode Two) has row redundancy been implemented and, if so, on which row addresses?

Test Mode Three) has column redundancy been implemented, and, if so, on which column addresses and for which outputs?

Figure 1:
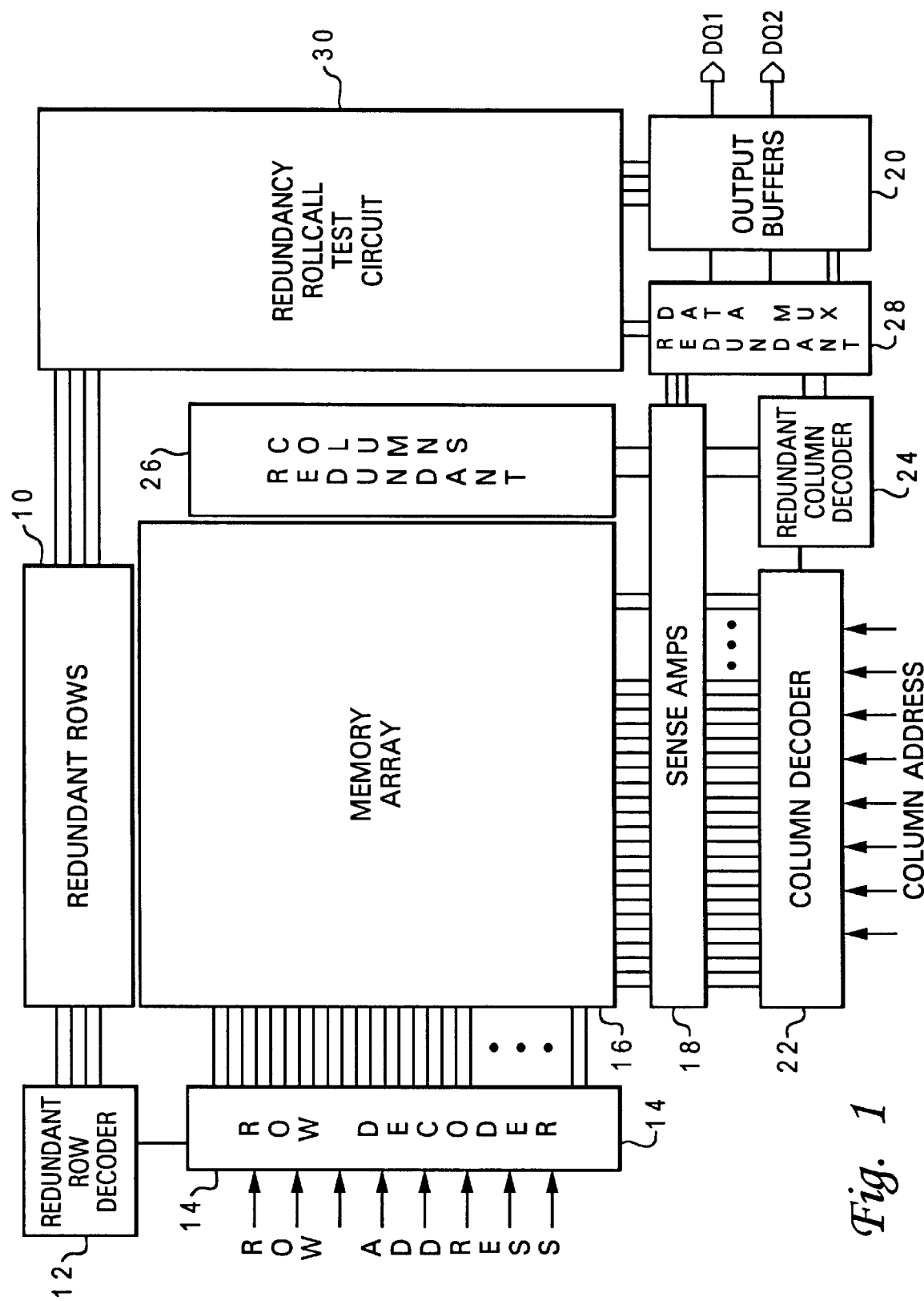
FIG. 1 is a schematic block diagram of a memory device as described in the preferred embodiment of the present invention.

With reference now to the figures and in particular with reference to FIG. 1, there is depicted a block diagram of a semiconductor memory array with redundant rows and columns. A redundant row in redundant rows 10 can be added to a memory design to replace defective cells in array 16 which are identified at the electrical test stage after wafer processing. The redundant row decoder 12 is programmed by blowing selected fuses to enable certain redundant rows 10 and to assign them addresses to which they will respond. When the address sent to row decoder 14 and redundant row decoder 12 corresponds to an address assigned to a redundant row, redundant row decoder 12 sends a row enable signal to redundant rows 10. Decode circuitry 14 is programmed to not respond to the address assigned to a redundant row. Sense amplifiers 18 read each column output of the selected redundant row and output the data to output buffers 20.

In a similar way, redundant columns 26 can be added to a memory design to replace defective columns in array 16.

The redundant column decoder 24 is programmed to respond to addresses of defective columns. When a column address is sent to column decoder 22 and redundant column decoder 24, sense amplifiers 18 read the addressed cells and transfer their digital contents to output buffers 20. When redundant columns are added to the memory design to replace defective cells, redundant column decoder 24 is programmed by blowing selected fuses to enable certain redundant columns and to assign them addresses to which they will respond. Thus, just as with the redundant rows, when an address corresponding to a programmed redundant column is sent to redundant column decoder 24, a redundant column in redundant columns 26 is enabled and its contents at the row addressed is sensed by sense amplifiers 18. The output from the redundant sense amplifier in sense amplifiers 18 is multiplexed into the multiple output lines of sense amplifiers 18 by redundant data mux 28.

The data is then transferred to output buffers 20 on multiple lines. In the example of FIG. 1, two columns are read out at output DQ1–DQ2. Output buffers 20 provide the drive current to output the memory array data off chip at outputs DQ1–DQ2. Typically, these output buffers 20 drive the output data directly to the output pins on the packaged part. Thus, the output buffers also provide protection from transients and other harmful inputs that could damage the memory array.

Redundancy rollcall test circuit 30 contains the circuitry for implementing the present invention. Test circuit 30 is comprised of logic circuitry which enables three tests to be performed on the packaged memory chip to acquire redundancy information.

Figure 2:
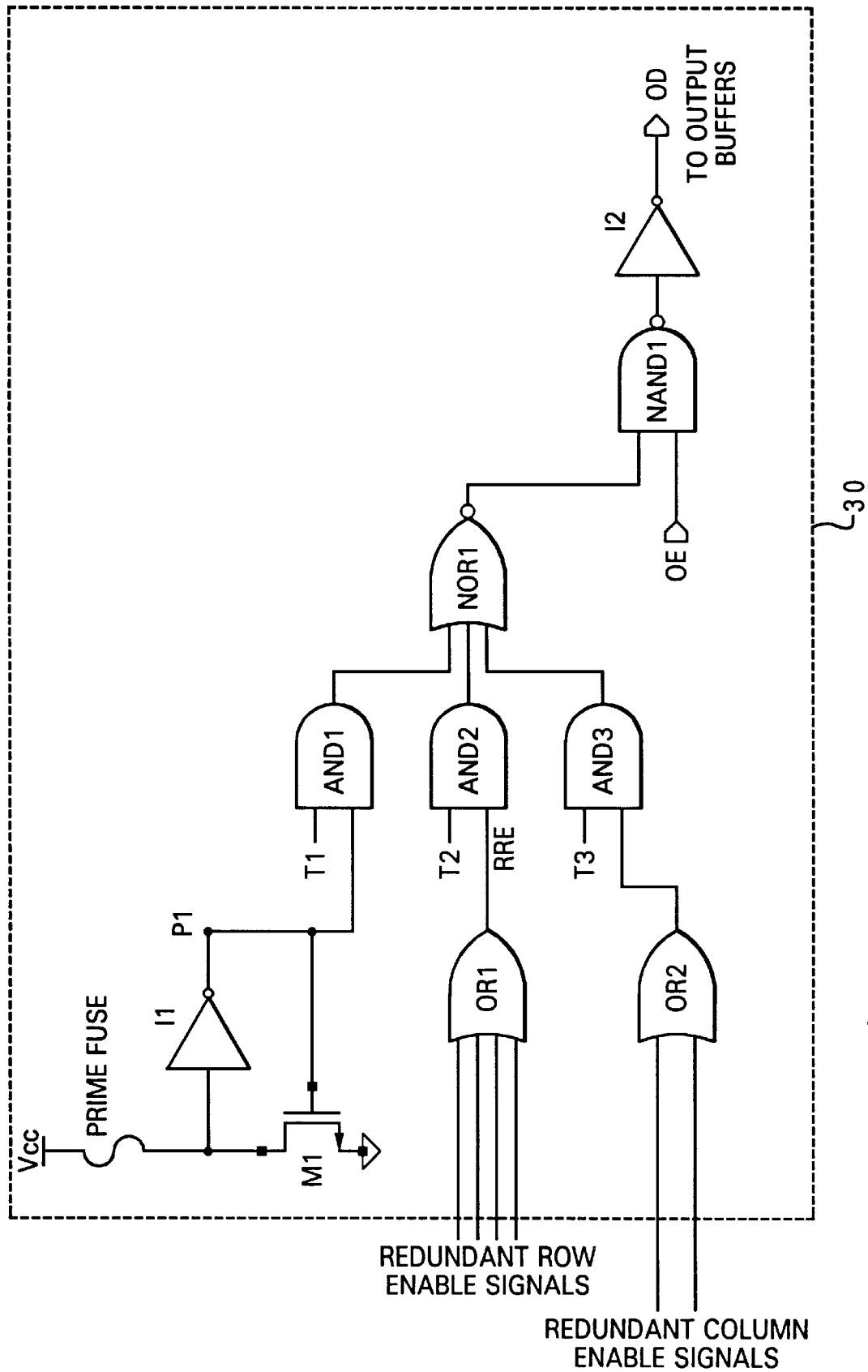
FIG. 2 is a schematic diagram of the redundancy rollcall test circuit as described in a preferred embodiment of the present invention.

Referring now to FIG. 2, until the memory chip is set into a redundancy test mode and one of the test signals T1, T2, or T3 is set high, NOR gate 1 outputs a high level signal. This enables the output buffers to operate in their normal tri-state operating mode by allowing the output enable signal OE to enable and disable (0–1) the output buffers through NAND1 and inverter 12.

FIG. 3 depicts a typical tri-state output buffer as used in SRAM and DRAM memory arrays. The signal DATA is output from memory array 16, placed on an output bus in sense amplifiers 18, brought through redundant data mux 28, and into output buffers 20. With the output disable signal OD set low, the data is input into a CMOS inverter consisting of pull-up transistor Q0 and pull-down transistor Q1 and output at DQ. With output disable signal OD set high to place the buffer in the open circuit tri-state mode, NOR gate 0 forces NMOS transistor Q1 off, and NAND gate 0 forces PMOS transistor Q0 off. This places the output buffer into a high impedance state when measured at DQ.

Referring back now to FIG. 2, before a test may be performed, the memory device must be configured into one of the three test modes. In order to take the packaged part out of its normal operating mode, a supervoltage would be clocked into one of the part's pins. Then, based on additional supervoltages applied or upon the state of various pins, logic circuitry on-chip configures the chip into the programmed mode. Configuring semiconductor chips into non-standard operating modes through the use of supervoltage procedures is well known in the art.

As used with the present invention, such logic circuitry would output test mode signal T1 when the chip is set to the first mode of the redundancy rollcall that of determining whether the chip is prime or has been repaired with redundancy. When set in the second test mode of determining redundant row addresses, test mode signal T2 is set high. When set in the third test mode of determining the addresses of redundant columns and of mapping their particular outputs, test mode signal T3 is set high. A second step in configuring the device is setting the output buffer disable signal high to place the output buffers 20 in an open circuit or tri-state mode. Last, the memory array is written to a logical 1 at every cell.

To perform Test Mode One, test mode signal T1 is input into AND gate 1. When the memory chip has not been repaired with redundant columns or rows, the chip is prime and the prime fuse remains intact. The upper rail voltage $V_{CC}$ is applied to inverter I1 creating a low input at AND1. This does not create a change in the output of NOR1 or in signal OD. This would leave the output buffers 20 in a high impedance state.

However, when the memory chip has been repaired with redundancy, the prime fuse will have been blown to indicate that redundancy was implemented. The input to inverter I1 falls to a low voltage producing a high output into AND1. Also, the high output of inverter I1 is applied to the gate of NMOS transistor M1 placing the transistor in its triode region and locking the input to inverter I1 low. If operating in Test Mode One with test signal T1 high, AND1 outputs a high level into NOR1.

Since the output enable signal OE is set high while configuring for the test mode, and a high into NOR1 creates a low output, NAND1 switches high. Output disable signal OD switches low. The change of state for OD is the "switching signal" for the redundancy rollcall circuit, and it commands the output buffer to switch from its high impedance tri-state to a low impedance rail, that of $V_{CC}$ or ground depending on the DATA signal input. In this case, we have written the entire array to a logical 1, so the output signal DQ will be set to $V_{CC}$.

Given the preceding, the first test mode of determining whether a memory chip is prime or has been repaired is performed by configuring the device in the first test mode by applying supervoltages to the pins of the packaged part. Then, the impedance of any one of the output pins is measured. If the output impedance is high, the chip has not been repaired. If the output impedance is low, the chip has been repaired with redundant rows or redundant columns or both.

Redundancy rollcall test modes Two and Three are functionally equivalent in the embodiment of FIG. 2. For Test Mode Two, all the redundant row enable signals produced by redundant row decoder 12 are input into OR1. When an address assigned to a redundant row is input into row decoder 14, redundant row decoder 12 produces an enable signal and sends it to redundant rows 10 to enable the addressed redundant line. Each of the redundant enable signals, in this case four, being sent to redundant rows 10 is tapped and summed in OR1. Similarly, the redundant column enable signals send from redundant column decoder 24 to redundant columns 26 are tapped and summed in OR2.

In operation, Test Mode Two or Test Mode Three is entered to perform a redundancy row or redundancy column rollcall test procedure, respectively. Just as with Test Mode One, test mode signal T2 or T3 is generated by circuitry based on a configuration of pins receiving a supervoltage, or the state of pins after receiving the supervoltage. Also, the chip is configured for a redundancy rollcall test by placing the device output buffers in a high impedance tri-state mode by setting the output enable signal high. The procedure continues by addressing every row and column in the memory array 16.

While in Test Mode Two, if any rows have been repaired and mapped to redundant rows 10, they will eventually be addressed because all row addresses are sequentially sent to row decoder 14. When redundant row decoder 12 reads the address of the redundant row, it outputs a high signal to OR1. This signal is ANDed with signal T2 at AND2 to create a high signal into NOR1 in. As seen with Test Mode One, this causes NOR1 to switch output levels and to send all output buffers to a low impedance state. Detector of this change in impedance indicates that the currently addressed row is a redundant row.

As can be seen in FIG. 2, Test Mode Three, that of testing for redundant column addresses, operates in the same manner. The packaged part is placed in Test Mode Three by applying supervoltages, the redundant column enable signals are input into OR2, and when a redundant column is addressed through the address pins, AND3 outputs a high signal to NOR1 sending the output buffer impedances low.

This embodiment has the advantage of implementing the redundancy rollcall while minimizing the number of transistors required. Only one circuit is required to conduct the rollcall tests for the entire chip. However, there are disadvantages. First, each individual output cannot be accessed in order to determine which output a redundant column has been mapped to unless circuitry is added to produce multiple OD signals to individually control each output buffer. This scheme would complicate bussing and chip layout, and would increase power requirements. Second, the circuit introduces signal delay on the output disable signal OD.

Referring now to FIG. 4, there is illustrated a schematic diagram of an alternative preferred embodiment of the redundancy rollcall circuit of the present invention. The redundancy rollcall circuit as used in the preferred embodiment is integrated within an output buffer such as the one depicted in FIG. 3 to create an output buffer as designed in FIG. 4. As can be seen, the redundancy rollcall circuit of FIG. 4 has little speed impact on the output disable signal OD and requires minimal bussing and layout area to implement. Moreover, it easily allows for independent control of each DO in Test Mode Three.

When reading out data in normal operation from the output buffer of FIG. 4, the output disable signal OD is set low. The output data arrives at the output buffer from sense amplifiers 18 through redundant data mux 28 after being accessed by the row and column address. The DATA signal is input into NAND2 and NOR2, while the output disable signal OD is input into NAND3, and NOR2. When the DATA signal is high, NAND2 has two high inputs, resulting in a low output. NOR2 has a high and a low input, resulting in a low output. The PMOS transistor Q2 and the NMOS transistor Q3 are connected in series to create a CMOS inverter output driver. With low inputs on transistors Q2 and Q3, output signal DQ will be high. When the DATA signal is low, NAND2's output is high. Also, both inputs into NOR2 are low, so its output is high. This forces output signal DQ low.

A redundancy rollcall test is performed on the packaged memory array as follows. The memory device must first be configured into one of the three test modes. This configuring was described in detail above for the first preferred embodiment. In summary, one of the three test modes is decoded based on the test entry stimulus of the packaged part, the entire array has all its cells written to a digital 1, and the output disable signal OD is set high.

Before a test signal T1, T2 or T3 is applied, the inputs to NOR3 are low and the inputs to NAND3 are high, resulting in a low input into NAND2. The low input into NAND2 creates a high input into PMOS transistor Q2 and turns it off. The high inputs into NOR2 creates a low output turning off NMOS transistor Q3. Consequently, with both transistors turned off, a high impedance is measured at the output pin corresponding to DQ.

If the first test mode is entered, signal T1 is set high. The memory device will contain a prime fuse, an inverter I1, and a transistor M1 configured as in FIG. 2. If the memory array has been repaired, the signal at node P1 will be set high as has been explained with FIG. 2. Both signal T1 and P1 are input into AND4. The resulting high output is input into NOR3, altering its output state from 1 to 0. This forces the output of NAND3 high, the output of NAND2 low, and switches on PMOS transistor Q2.

As can be seen from this description, the output impedance as measured from the output pin at DQ switches from a high impedance to a low impedance during Test Mode One if the memory array has been repaired with redundant rows or columns. The signal P1 coming from the prime test circuit is common to all output buffers 20. Thus, all output pins on the packaged part, in this case DQ1–DQ2, will have their impedance switched low. It is possible to implement the design of FIG. 4 by including AND4 within only one output buffer of the memory array so that only one particular output pin would be measured during the first test mode.

To perform the second redundancy rollcall test, that of determining which row addresses access redundant rows, a supervoltage is applied to a unique combination of pins on the packaged part to enter Test Mode Two. Logic circuitry at the input pins determines that the second test mode is entered and sets signal T2 high. The redundant row enable signals from row redundant decoder 10 are summed together in an OR gate to produce a redundant row enable signal RRE, just as was described with FIG. 2. Signal T2, along with redundant row enable RRE, are input into AND5. When a redundant row encoded into redundant row decoder 12 is addressed, the output signal which enables the redundant row in redundant rows 10 also sets signal RRE high. With signal T2 and RRE high, the output of AND gate 5 is forced high. With identical transitions for NOR3, NAND3, NAND2, and transistor Q2 as was seen for Test Mode One, it can be seen that the output pin at DQ has its output impedance switched from high to low and the output voltage is switched high. Also, just as with Test Mode One, the row redundancy rollcall test can be implemented within all output buffers 20 or within just a single designated output buffer.

The third test mode is the column redundancy rollcall test. A supervoltage is applied to a unique combination of the chip's pins to place the part in Test Mode Three. The input logic circuitry senses the test mode and sets signal T3 high. The entire memory array is written to logical one, resulting in a high DATA signal input to output buffers 20. Also, output disable signal OD is set high. Signal RDM input to AND6 is a derivative of the redundant column enable signals output from redundant column decoder 24 to redundant columns 26. However, signal RDM is not common to every output buffer. The redundant data mux signal RDM originates in the redundant data mux 28 and is encoded along with the redundant columns to designate which output pin the redundant column will map to. When a redundant column is addressed, the redundant data mux 28 sends the column's data to the column's corresponding output pin by setting signal RDM. Signal RDM is an output muxing signal such as the DQ muxing signal seen on the SGS-THOMSON SRAM part number 68128.

Figure 5:
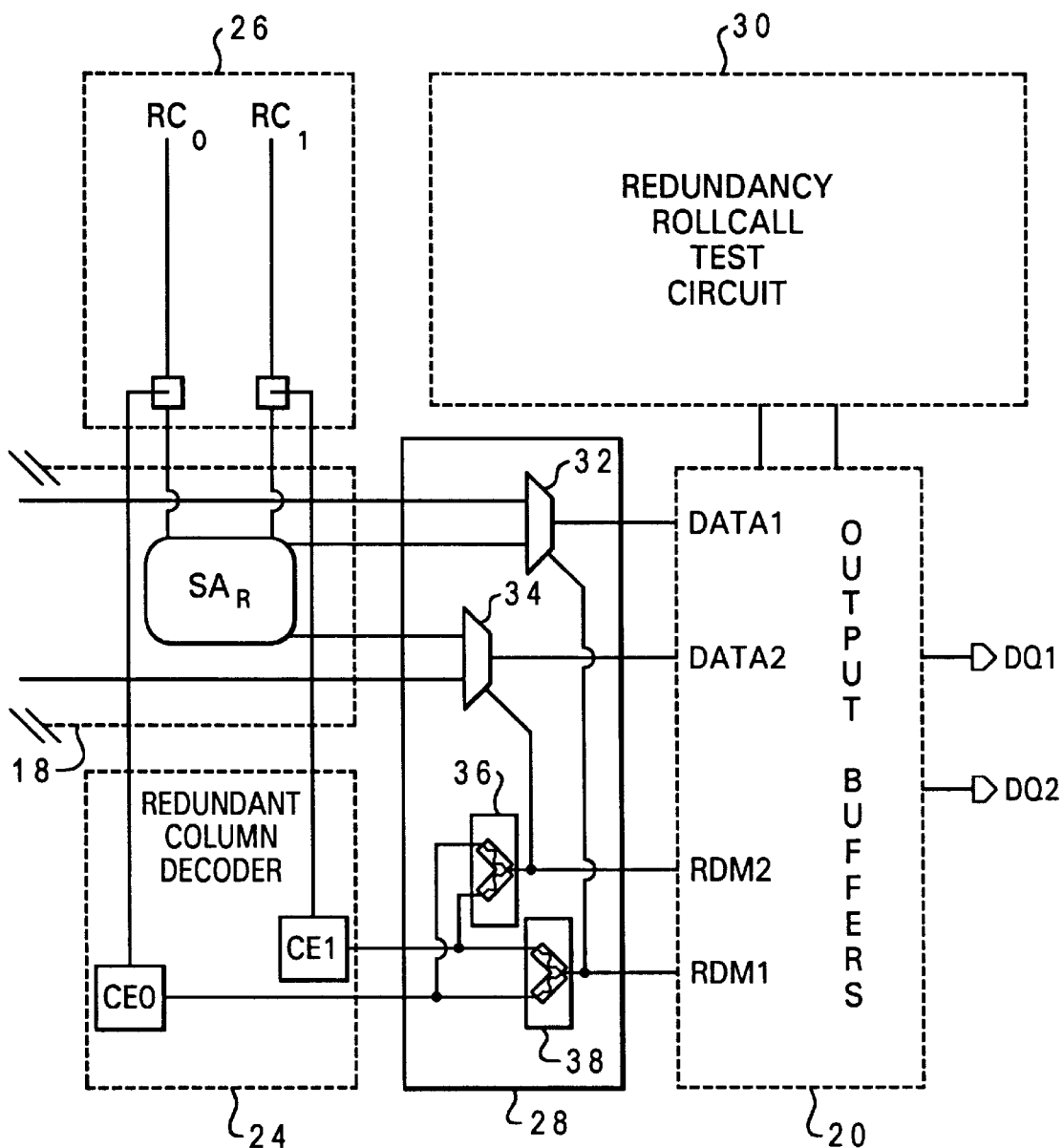
FIG. 5 is an exploded schematic block diagram of the redundant column circuitry depicted in the memory device of FIG. 1 as used in the preferred embodiment of the present invention.

Generation of the redundant data mux signal RDM can best be described with reference to FIG. 5. When a redundant column is addressed at redundant column decoder 24, an enable signal is sent to the corresponding redundant column. FIG. 5 depicts a memory array having only two redundant columns, RC0 and RC1, in redundant columns 26. Typically, the device would contain many more redundant columns but for simplicity only two redundant columns are used in this example. Two redundant columns are input into sense amplifier $SA_R$. When a particular redundant column is addressed, the redundant column decoder 24 sends an enable signal to the pass-gate of that corresponding column. This allows the sense amplifier to read the redundant column's data line and output to the redundant data mux 28 and into muxing devices 32 and 34. These devices allow a 2–1 mux: the output is switched to one of the two inputs by a control signal. One of the data bus lines from sense amplifiers 18 carrying data from memory array 16 is input into mux device 32. A second data bus from sense amplifiers 18 is input into muxing device 34.

The two redundant column enable signals sent to the pass-gates of RC0 and RC1 are also sent to decoding gates 36 and 38. The output of decoding gate 36 is attached to the control line of muxing device 34, and the output of decoding gate 38 is attached to the control line of muxing device 32. These decoding gates contain fuses associated with the column enable signals. When the fuses are not blown, they allow both input lines to control the output of the decoding gate, and, as can be seen from FIG. 5, both column enable signals from redundant column decoder 24 will control the muxing device at its control line.

When redundancy is implemented on the memory chip during production and before packaging, one or both of the fuses is blown. The fuses left intact in decoding gates 36 and 38 will map out the outputs to which the redundant columns RC0 and RC1 will be sent. This can best be explained by the following example. Assume that redundant column RC0 is to be mapped out to DATA2, the input to the second output buffer in output buffers 20. When redundant column RC0 is enabled by column enable signal CE0, its output is sent through sense amplifier $SA_R$ into muxing device 34. The redundant column enable signal CE0 is also sent to decoding gate 36. The output of decoding gate 36 is the control for mux device 34. Because column RC0 will be mapped to DATA2, the fuse within decoding gate 36 connected to CE0 will be intact. The fuse connected to CE1 will have been blown if CE1 does not map to that particular output. When redundant column RC0 is addressed, the column enable signal CE0 is sent through decoding gate 36 to muxing device 34 to switch the output of muxing device 34 on DATA2 from the normal data bus sent from sense amplifiers 18 to the output of sense amplifier $SA_R$ which contains redundant column data from RC0.

In the same way, decoding gate 38 controls muxing device 32. Thus, if RC0 or RC1, or both, are to be mapped to the first output buffer at DATA1, the corresponding fuses in decoding gate 38 would be left intact during the redundancy implementation and the corresponding fuses in 36 are blown. A more detailed description of the circuit described in FIG. 5 can be found in U.S. patent application, Ser. No. 07/830,314 and U.S. patent application, Ser. No. 08/099,606, incorporated herein by reference.

The redundant data mux signal RDM is the signal output from the decoding gates. For each output buffer, the control signal output from decoding gates 36 and 38 that switches the outputs of muxing devices 32 and 34 from the normal data line output from sense amplifiers 18 to the redundant data line output from redundant sense amplifier $SA_R$ is also input into the redundant rollcall circuit in output buffers 20 as signals RDM1 and RDM2.

Referring now back to FIG. 4, Test Mode Three proceeds as follows. The test mode signal T3 has already been set high. The column addresses are sequentially toggled through at the address pins of the packaged part. When a redundant column is addressed, the redundant data mux 28 outputs redundant data mux signal RDM. Only one of the signals, RDM1 or RDM2 will go high depending on which output the redundant column has been mapped to. Thus, only one of the output buffers will receive a high RDM signal at AND6. This will produce a high input into NOR3 and a low input into NAND3. NAND3 will output a high switching signal into the output buffer circuit at NAND2. The voltage at PMOS transistor Q2 will switch from a high voltage to a low voltage, turning it on. The impedance at the output pin corresponding to that output buffer will be measured as switching, or changing its state, from a high impedance to a low impedance high voltage rail. Therefore, when in Test Mode Three, an output pin changing its state from a high to a low impedance marks the inputted address as corresponding to a redundant column which will be output on that particular output pin.

The test procedure continues by addressing each column within the array. As each address is sent, the impedance on each of the output pins is measured. When the impedance drops to a low value, it may be concluded that the inputted address corresponds to a redundant column. The addresses are toggled through until all column addresses have been sent and redundant addresses and their corresponding output pin have been determined.

A variation on the preferred embodiment implementation would be to combine test modes two and three. This embodiment would only require one test signal, T2, to be set when entering the row and column redundancy test mode, rather than the T2 and T3 signals required for the above embodiment. The circuit would be identical to that of FIG. 4 except that both AND5 and AND6 would have signal T2 inputs. It can be seen that when in this combined mode, all rows and columns in the array would be addressed. When all output pins on the chip fall to a low impedance, a redundant row has been addressed. When only one or two, or some number of outputs less than all, fall to a low impedance, a redundant column or columns have been addressed and their outputs have been mapped to these outputs.

Although the circuit of FIG. 4, is the preferred embodiment of the present invention, there are various other ways of combining logic gates to implement the redundancy rollcall claimed herein. First, NAND3 could be converted to a NOR gate and NOR3 could be converted to a NAND gate, AND gate 4–6 would be changed to NAND gates, and the logic of the output disable signal would be inverted by placing signal OD to a low level during the rollcall test. This configuration would result in the output making a transition from a low impedance to a high impedance when a test mode is entered and a proper test stimulus (i.e. P1, RRE, or RDM) is input. Similarly, the six test signals could be logically combined through a series of logic gates into NOR2 to switch on and off transistor Q3 to perform the redundancy rollcall test as described above.

It can be seen from the foregoing description that a redundancy rollcall procedure has been provided which allows a packaged semiconductor memory chip to be tested directly through its I/O pins to determine whether redundant elements (rows or columns) have been implemented on the memory device and to which addresses they have been assigned. Moreover, the redundancy rollcall test circuit is designed into a standard output buffer without introducing a speed impact on the data path. The present invention is practiced by: first, entering one of the three test modes by applying a test stimulus; second, sequentially addressing every row, every column, or both; third, as each row and column is addressed, measuring the impedance of the output pins. When the output pins drop from a high impedance to a low impedance, the inputted address will correspond to a redundant element.

It should be noted that the present invention does not require the implementation of all three test modes in the preferred embodiment. The three test modes could be collapsed into one test mode. The test circuit would be configured as in FIG. 4 except that AND4 would not be included and signal T2 and T3 would be combined as a single test mode signal. The memory device would be configured for the test mode, and all cells of the array would be sequentially addressed. The three questions of redundancy implementation could be answered purely by analyzing the change in state of the memory chip's output pins. First, if any output pin changes state the chip has been repaired. Second, if all output pins change states, row redundancy has been implemented at that address. Third, if some number less than all of the output pins change state, column redundancy has been implemented on redundant columns mapped to those outputs and on that address.

While the invention has been particularly shown and described with reference to a preferred embodiment, it will be understood by those skilled in the art that various changes in form and detail may be made therein without departing from the spirit and scope of the invention.

What is claimed is:

1. A method of testing a packaged semiconductor memory device to acquire information on redundant elements, said method comprising the steps of:

configuring the device in a test mode; and in response to configuring the device into a first test mode, sensing a first programmed signal indicating that redundancy has been implemented on the device, and changing the state of at least one output pin when the first signal has a preselected value.

2. The method of testing a packaged semiconductor memory device to acquire information on redundant elements according to claim 1, and further comprising the steps of, in response to configuring the device in a second mode, determining whether a redundant row is addressed by an address present at address input pins of the device, and changing the state of an output pin when a redundant row is addressed.

3. The method of testing a packaged semiconductor memory device to acquire information on redundant elements according to claim 2, wherein the step of determining whether a redundant row is addressed comprises sequentially addressing selected rows of the device, and sensing when a redundant row has been addressed.

4. The method of testing a packaged semiconductor memory device to acquire information on redundant elements according to claim 1, and further comprising the step of, in response to configuring the device into a third mode, determining whether a redundant column is addressed by an address present at address input pins of the device, and changing the state of an output pin corresponding to the redundant column addressed when a redundant column is addressed.

5. The method of testing a packaged semiconductor memory device to acquire information on redundant elements according to claim 4, wherein the step of determining whether a redundant column is addressed comprises sequentially addressing selected columns of the device, and sensing when a redundant column has been addressed.

6. The method of testing a packaged semiconductor memory device to acquire information on redundant elements according to claim 4, further including the step of, in response to configuring the device in a second mode, determining whether a redundant row is addressed by an address present at address pins of the device, and changing the state of an output pin when a redundant row is addressed.

7. The method of testing a packaged semiconductor memory device to acquire information on redundant elements according to claim 1, wherein the step of changing the state of the output pin comprises switching the output pin from a first value to a second value when the first test signal indicates that redundancy has been implemented on the device.

8. The method of testing a packaged semiconductor memory device to acquire information on redundant elements according to claim 7, wherein the step of changing the state of the output pin comprises switching the output pin from a high impedance to a low impedance when the first test signal indicates that redundancy has been implemented on the device.

9. The method of testing a packaged semiconductor memory device to acquire information on redundant elements according to claim 7, wherein the step of changing the state of the output pin comprises switching the output pin from a high voltage to a low voltage when the first test signal indicates that redundancy has been implemented on the device.

* * * * *